United States Patent
Kamath et al.

(10) Patent No.: US 7,413,996 B2
(45) Date of Patent: Aug. 19, 2008

(54) HIGH K GATE INSULATOR REMOVAL

(75) Inventors: Arvind Kamath, Mountain View, CA (US); Wai Lo, Lake Oswego, OR (US); Venkatesh Gopinath, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 718 days.

(21) Appl. No.: 10/413,051

(22) Filed: Apr. 14, 2003

(65) Prior Publication Data

US 2004/0203246 A1 Oct. 14, 2004

(51) Int. Cl.
*H01L 21/00* (2006.01)

(52) U.S. Cl. ............... 438/745; 438/689; 438/369; 438/694; 438/766

(58) Field of Classification Search ........... 438/694, 438/745, 766, 369
See application file for complete search history.

(56) References Cited

U.S. PATENT DOCUMENTS

| | | | |
|---|---|---|---|
| 6,063,698 A | 5/2000 | Tseng et al. | 257/E21.194 |
| 6,303,418 B1 | 10/2001 | Cha et al. | 257/E21.637 |
| 6,455,330 B1 | 9/2002 | Yao et al. | 257/E21.193 |
| 6,455,382 B1 * | 9/2002 | Lin et al. | 438/296 |
| 6,538,271 B2 * | 3/2003 | Saida et al. | 257/212 |
| 6,656,852 B2 | 12/2003 | Rotondaro et al. | 134/1.3 |
| 6,764,898 B1 * | 7/2004 | En et al. | 438/240 |
| 6,818,516 B1 * | 11/2004 | Lo et al. | 438/287 |
| 6,818,553 B1 | 11/2004 | Yu et al. | |
| 6,855,639 B1 | 2/2005 | Brask et al. | |
| 2002/0168826 A1 * | 11/2002 | Jin et al. | 438/301 |
| 2003/0230549 A1 * | 12/2003 | Buchanan et al. | 216/41 |
| 2004/0129674 A1 | 7/2004 | Bease et al. | |
| 2005/0048791 A1 | 3/2005 | Brask et al. | |
| 2005/0115925 A1 | 6/2005 | Paraschiv et al. | |

FOREIGN PATENT DOCUMENTS

JP 59121965 A * 7/1984

OTHER PUBLICATIONS

Shirato, Semiconductor Device, Jul. 14, 1984, Englisn Abstract of JP 59121965 A, 2 pages.*

* cited by examiner

*Primary Examiner*—Shamim Ahmed
(74) *Attorney, Agent, or Firm*—Luedeka Neely & Graham

(57) ABSTRACT

A method of forming a high k gate insulation layer in an integrated circuit on a substrate. A high k layer is deposited onto the substrate, and patterned with a mask to define the high k gate insulation layer and exposed portions of the high k layer. The exposed portions of the high k layer are subjected to an ion implanted species that causes lattice damage to the exposed portions of the high k layer. The lattice damaged exposed portions of the high k layer are etched to leave the high k gate insulation layer.

4 Claims, 3 Drawing Sheets

HIGH K GATE INSULATOR REMOVAL

FIELD

This invention relates to the field of integrated circuit fabrication. More particularly, this invention relates to improved processes and structures for gate electrode isolation layer formation.

BACKGROUND

Silicon dioxide has typically been used as the dielectric material between the electrically conductive gate electrode, often formed of polysilicon, and the semiconducting channel of a transistor, which is typically formed of silicon. Silicon dioxide has provided adequately high capacitance for gate insulation in the past, with devices having gate geometries of about 130 nanometers and greater. However, with the ever increasing demands of scaled-down device geometries and more densely populated integrated circuits, silicon oxide tends to no longer be good enough for the gate insulation layer.

Current transistor geometries use a gate insulation layer of silicon dioxide that is about twelve to sixteen angstroms thick, or the thickness of about six to ten individual silicon atoms. The silicon dioxide layer gates the electrons through the channel, controlling the flow of electricity across the transistor. However, when the transistor is reduced in size, the silicon dioxide gate insulation layer is also proportionally thinned. As gate lengths decrease from one hundred and thirty nanometers to ninety, sixty-five, and even thirty nanometers, the thickness of the silicon oxide gate will be reduced to less than ten angstroms, or to about three monolayers.

Unfortunately, once the gate insulation layer is reduced to less than about twenty angstroms, the silicon dioxide is no longer able to provide effective insulation from the effects of quantum tunneling currents, and the transistor tends to exhibit relatively high leakage.

Thus, the integrated circuit fabrication industry is searching for gate insulator materials with a low equivalent oxide thickness that mimics the electrical properties of very thin silicon dioxide, while providing a thicker physical layer over the channel to prevent quantum-mechanical tunneling. New materials in the form of oxides of heavy and rare earth metals, with higher dielectric constants and higher capacitances have been investigated with some promising results, including HfSiON, $ZrO_2$, $HfO_2$, HfON, $La_2O_3$, $CeO_2$, $Na_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$.

However, these so-called high k materials have other problems associated with their use. For example, they do not easily form volatile compounds and are relatively difficult to remove by either dry etching or wet etching. Dry etching has been attempted with ion milling or bombardment and sputtering with the use of argon or other inert ions. However, the process is time consuming and can cause extensive damage to the surrounding structures, such as the polysilicon gate electrode. The necessarily extended use of plasma as an etch tends to increase the plasma damage to the substrate itself, as well as to other structures.

There is a need, therefore, for a method whereby such high k materials can be patterned and etched without unduly damaging the surrounding structures that are formed in a conventional CMOS process flow.

SUMMARY

The above and other needs are met by a method of forming a high k gate insulation layer in an integrated circuit on a substrate. A high k layer is deposited onto the substrate, and patterned with a mask to define the high k gate insulation layer and exposed portions of the high k layer. The exposed portions of the high k layer are subjected to an ion implanted species that causes lattice damage to the exposed portions of the high k layer. The lattice damaged exposed portions of the high k layer are etched to leave the high k gate insulation layer.

Because the lattice damaged high k material etches at a much faster rate than does the undamaged high k material, this process advantageously makes use of an etch that can proceed at an acceptably high etch rate. The higher the degree of crystallinity in the non lattice damaged portions of the high k layer, the greater the etch differential between the non lattice damaged portions of the high k layer and the lattice damaged portions of the high k layer. Further, because the protected high k layer is not lattice damaged, the etch is extremely anisotropic, tending only to appreciably remove those portions of the high k layer that have received lattice damage, and not undercutting the high k gate insulation layer underlying the masking layer to any appreciable extent.

In various preferred embodiments, the high k layer comprises hafnium dioxide, or alternately at least one of HfSiON, $ZrO_2$, HfON, $La_2O3$, $CeO_2$, $Na_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$. The ion implanted species is preferably at least one of nitrogen, argon, arsenic, and boron. Preferably, the ion implantation is conducted at a dopant level of about $5(10)^{14}$ atoms per square centimeter. The etching is preferably a wet etch using a solution of hydrofluoric acid.

In one embodiment there is an additional step of forming a base interface layer on the substrate prior to the step of depositing the high k layer. In one preferred embodiment the ion implantation is a source/drain ion implantation process. Preferably, the mask used in the patterning step is a gate electrode layer of sufficient thickness to inhibit penetration of the ion implanted species through the mask and into the high k gate insulation layer. The mask may also be a gate electrode layer with an overlying hard mask of sufficient combined thickness to inhibit penetration of the ion implanted species. Further, the mask may be a gate electrode layer with adjacent gate electrode sidewall spacers of sufficient thickness to inhibit penetration of the ion implanted species through the mask and into the high k gate insulation layer.

According to another aspect of the invention there is described a method of forming a high k gate insulation layer in an integrated circuit on a substrate. A base interface layer is formed on the substrate, and a high k layer of $HfO_2$ is deposited onto the base interface layer. The high k layer is patterned with a gate electrode layer and an overlying hard mask to define the high k gate insulation layer and exposed portions of the high k layer. The exposed portions of the high k layer are subjected to an ion implanted species that causes lattice damage to the exposed portions of the high k layer. The lattice damaged exposed portions of the high k layer and the underlying base interface layer are etched with HF to leave the high k gate insulation layer.

In various preferred embodiment of this aspect, the ion implanted species is preferably inert to the $HfO_2$, such as at least one of nitrogen and argon. The ion implantation is preferably conducted at a dopant level of about $5(10)^{14}$ atoms per square centimeter.

According to yet another aspect of the invention, there is described a method of forming a high k gate insulation layer in an integrated circuit on a substrate. A base interface layer is formed on the substrate, and a high k layer of $HfO_2$ is deposited onto the base interface layer. The high k layer is patterned with a gate electrode layer and adjacent gate electrode sidewall spacers to define the high k gate insulation layer and exposed portions of the high k layer. The exposed portions of the high k layer are exposed to an ion implanted species that causes lattice damage to the exposed portions of the high k layer, where the ion implanted species also forms source/drain regions in the substrate. The lattice damaged exposed portions of the high k layer and the underlying base interface layer are etched with HF to leave the high k gate insulation layer. Most preferably the ion implanted species is at least one of arsenic and boron.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
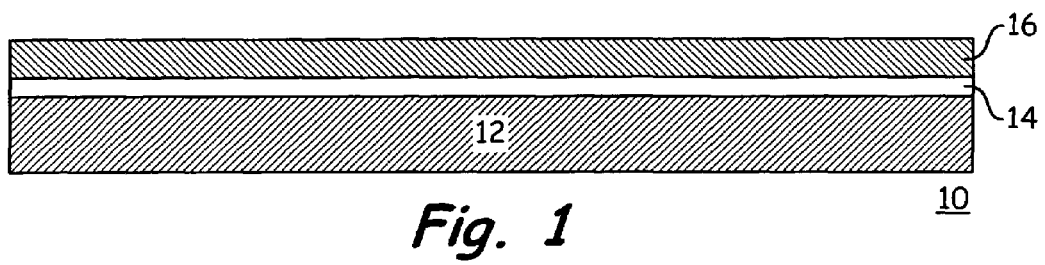
FIG. 1 is a cross sectional representation of an integrated circuit with a base interface layer and a high k layer.

With reference now to FIG. 1, there is depicted a cross sectional representation of an integrated circuit 10 with a base interface layer 14 and a high k layer 16 formed on a base substrate 12. It is appreciated that the dimensions as depicted in the figures are not to scale, so that elements that are very small in comparison to other elements can be seen without undue complication of the figures. It is further appreciated that designation of "substrate" as used herein refers to either or both of the base substrate 12, or all of the layers—including the base substrate 12—on top of which another layer is formed.

In the preferred embodiment the base interface layer 14 is a layer of silicon dioxide having a thickness of between about zero angstroms and about twenty angstroms, or a silicon oxynitride layer. However, the base interface layer 14 is an optional layer, and is not present in some of the embodiments of the invention. The high k layer 16 is preferably formed with a thickness of between about fifteen angstroms and about two hundred angstroms, and is preferably formed of an oxide of a heavy or rare earth metal, including at least one of the materials such as HfSiON, $ZrO_2$, $HfO_2$, HfON, $La_2O3$, $CeO_2$, $Na_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$. Most preferably, the high k layer 16 is formed of hafnium dioxide. The dielectric constant of the high k layer 16 is preferably greater than that of silicon dioxide, and most preferably between about twelve and about thirty.

The high k layer 16 is preferably initially formed as an amorphous layer, although depending upon the process used, it may also be initially formed as a crystalline layer. However, regardless of how it is initially formed, the high k layer 16 tends to take on a relatively high degree of crystalline structure upon the first high temperature heat treatment that it receives. Upon become crystalline, the high k layer 16 become extremely difficult to etch using standard processing. Thus, while the method described herein are applicable to both amorphous and crystalline high k layers 16, they are especially of value when the high k layer 16 has a high degree of crystal structure prior to etching.

Figure 2:
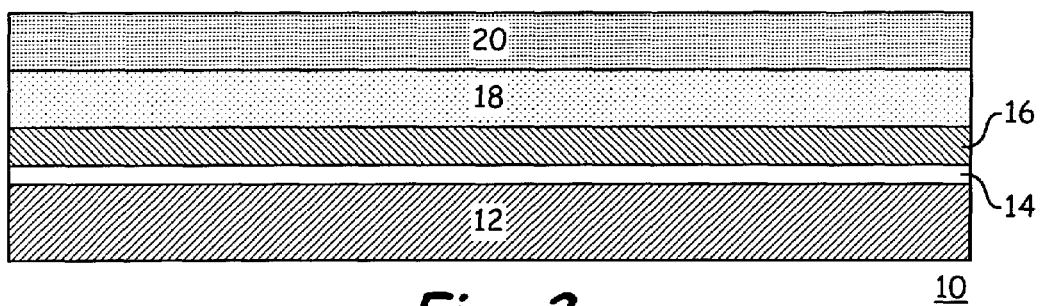
FIG. 2 is a cross sectional representation of an integrated circuit with a base interface layer and a high k layer, overlaid with a gate electrode layer and a hard mask layer.

A mask layer is formed over the high k layer 16. As depicted in FIG. 2, the mask layer preferably includes at least a gate electrode layer 18, and may also include an optional hard mask layer 20. The gate electrode layer 18 is preferably formed of polysilicon, and the optional hard mask layer 20 is preferably formed of silicon nitride. A masking layer 22 is applied on top of the mask layer, such as on top of the gate electrode layer 18 and the optional hard mask layer 20. The masking layer 22 is preferably a photoresist. The masking layer 22 is then patterned and used to etch the pattern into the underlying mask layer, as depicted in FIG. 3.

Figure 3:
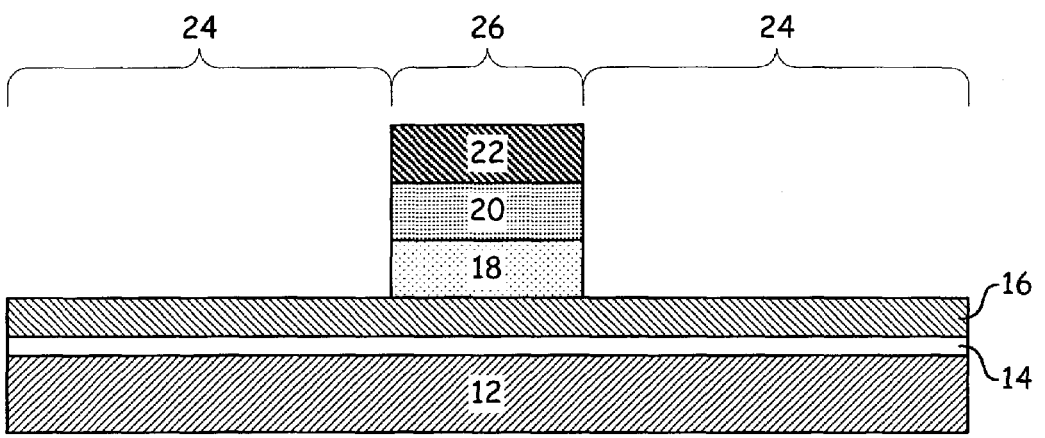
FIG. 3 is a cross sectional representation of an integrated circuit with a base interface layer and a high k layer, overlaid with a patterned gate electrode layer, hard mask layer, and masking layer.

As seen in FIG. 3, the etching process used to define the mask layer, which in this case is a gate electrode layer 18 and optional hard mask layer 20, does not etch the high k layer 16, because the high k layer 16 tends to be extremely resistive to etching, as described above. Therefore, the high k layer 16 tends to provide an excellent etch stop to the etching process used to define the mask layer 18 and 20. The patterned mask layer 18 and 20 also defines a high k gate insulation layer region 26, which underlies the mask layer 18 and 20, and exposed portions 24 of the high k layer 16. Once the etching of the mask layer 18 and 20 is accomplished, the masking layer 22 is preferably removed, such as in an ashing process.

Figure 4:
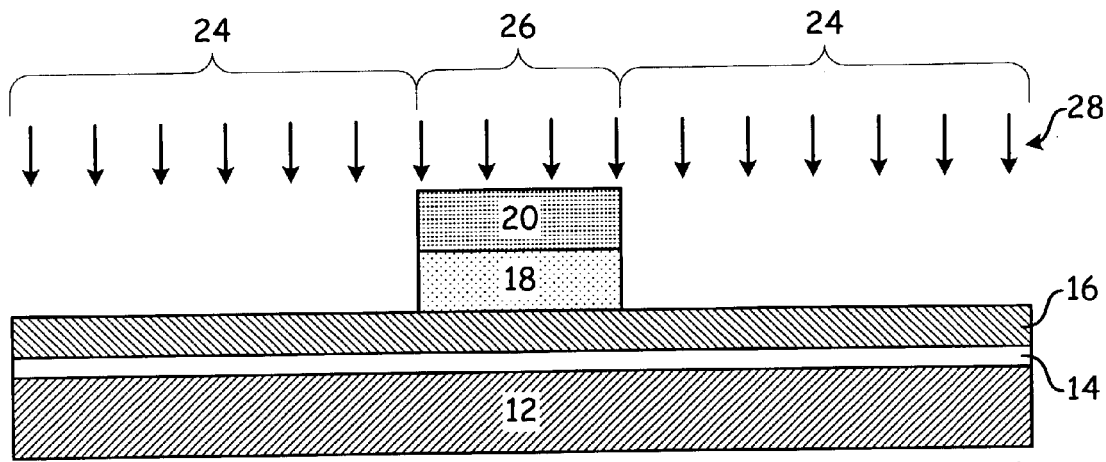
FIG. 4 is a cross sectional representation of an integrated circuit with a base interface layer and a high k layer receiving an ion implanted species that damages the lattice structure of the high k layer.

The exposed portions 24 of the high k layer 16 are subjected to the ion implantation of a species 28 that causes lattice damage to the exposed portions 24 of the high k layer 16, as depicted in FIG. 4. However, the mask layer 18 and 20 is preferably sufficiently resistant to the ion implantation so as to prohibit the implanted species from penetrating the mask 18 and 20 and damaging the high k layer 16 in the region 26. In a preferred embodiment, the implanted species 28 is relatively inert to the high k layer 16, such as nitrogen or argon, but which is of sufficient mass, or is implanted with sufficient energy and dosage, so as to cause lattice damage to the exposed portions 24 of the high k layer 16. Other implanted species 28 may also be used, some as specifically described hereafter. Preferably the ion implantation is conducted at a dopant level of about $5(10)^{14}$ atoms per square centimeter.

Figure 5:
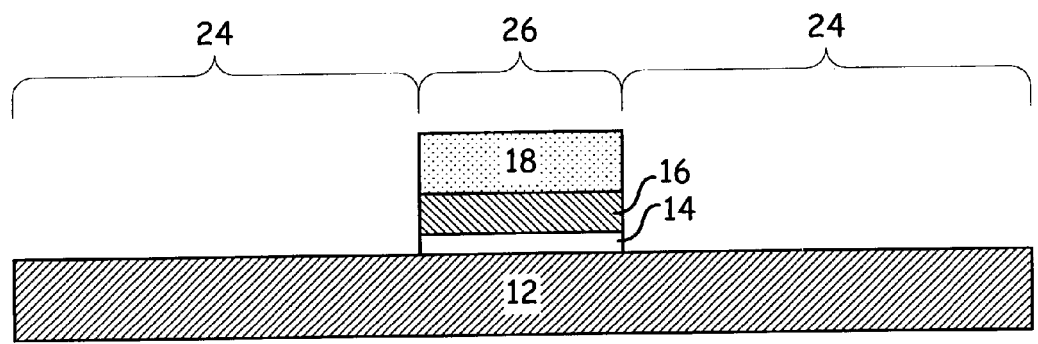
FIG. 5 is a cross sectional representation of an integrated circuit with a patterned base interface layer, high k layer, and gate electrode layer.

Once the lattice damage has been caused to the exposed portions 24 of the high k layer 16, the exposed portions 24 of the high k layer 16 can be etched relatively easily, as compared to those portions 26 of the high k layer 16 that have not sustained lattice damage. Most preferably the etching process is a wet etch using a solution of hydrofluoric acid. As the hydrofluoric acid is relatively selective as to the underlying base substrate 12, which is most preferably silicon, substantially all of the exposed portion 24 of the high k layer 16 and underlying portions of the base interface layer 14 are removed during the etch process, but the underlying base substrate 12 is not damaged to any appreciable degree by the etch process. The resultant structure is depicted in FIG. 5. At this point, subsequent processing is accomplished, such as according to the desired and normal CMOS process flows.

Because the protected and undamaged portion 26 of the high k layer 16 does not etch at an appreciable rate, or at least etches at a rate that is dramatically less than the rate at which the lattice damaged portion 24 of the high k layer 16 etches, the etching process, even though preferably accomplished as a wet etch, is substantially anisotropic. In other words, the etching process does not undercut the high k layer 16 in the protected regions 26 to any substantial degree, because the etch rate of the high k layer 16 in the protected regions 26 is so low.

Figure 6:
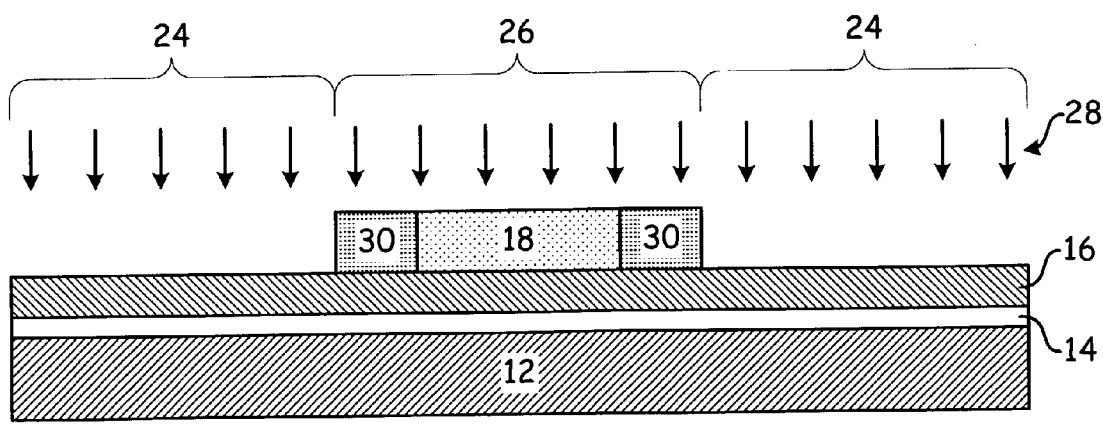
FIG. 6 is a cross sectional representation of an integrated circuit with a base interface layer and a high k layer, overlaid with a gate electrode layer and adjacent gate electrode sidewall spacers.

The blanket ion implantation of the exposed portions 24 of the high k layer 16 can be accomplished as a part of the standard processing of the integrated circuit 10, as next described. In this embodiment, the gate electrode layer 18 is deposited, patterned, and formed, and oxide sidewall spacers 30 are also deposited, patterned, and formed. The gate electrode layer 18 and the oxide sidewall spacers 30 then constitute the mask which is used to protect the region 26 of the high k layer 16, as depicted in FIG. 6.

In this embodiment, the implanted species 28 is preferably the species that is used to create the source/drain regions in the base substrate 12, and the process is the standard source/drain implant process, with whatever modification may be necessary to implant the source/drain dopant through the exposed portions 24 of the high k layer 16. As before, the mask 18 and 30 is preferably of a sufficient thickness to prohibit penetration of the implanted species 28 into the protected region 26 of the high k layer 16. An optional hard mask or photoresist mask can be added as desired over the mask 18 and 30. Such a photomask could be easily added as a part of the photomask used to define the source/drain regions into which the source/drain dopant 28 is to be implanted.

Figure 7:
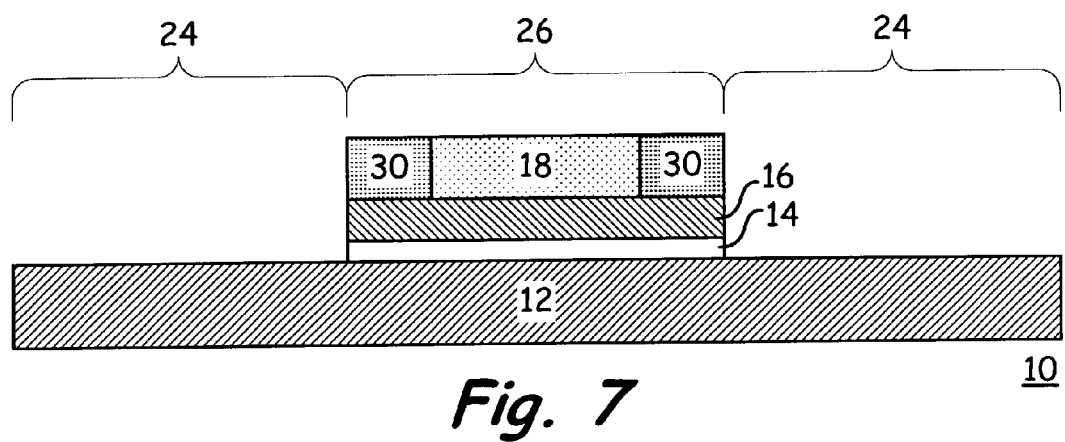
FIG. 7 is a cross sectional representation of an integrated circuit with a patterned base interface layer and high k layer.

Once the lattice damage caused by the source/drain implantation is sustained in the exposed portions 24 of the high k layer 16, those portions 24 can be removed, such as with a wet etch as described above. The resultant structure is depicted in FIG. 7.

However, in either of the general processing flows described above, the use of a blanket ion implantation to damage the lattice structure of the exposed portions 24 of the high k layer 16 allows the high k layer 16 to be adequately etched, such as in an aqueous hydrofluoric acid solution, while neither the underlying base substrate 12 or the protected portion 26 of the high k layer 16 are appreciably etched or damaged.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of forming a high k gate insulation layer in an integrated circuit on a substrate, the method comprising the sequential steps of:
   depositing a base layer onto the substrate,
   depositing a high k layer onto the base layer,
   depositing a gate electrode layer onto the high k layer,
   depositing a hard mask layer onto the gate electrode layer,
   depositing a photoresist layer onto the hard mask layer,
   removing portions of the photoresist layer to expose portions of the hard mask layer,
   etching the exposed portions of the hard mask layer and underlying portions of the gate electrode layer to expose portions of the high k layer,
   removing all remaining portions of the photoresist layer,
   subjecting the exposed portions of the high k layer to an ion implanted species that causes lattice damage to the exposed portions of the high k layer, while the exposed portions of the hard mask layer remain on the gate electrode layer,
   etching both the lattice damaged exposed portions of the high k layer to leave the high k gate insulation layer and the base layer with a single etching step.

2. The method of claim 1, wherein the high k layer comprises at least one of HfSiON, $ZrO_2$, HfON, $La_2O3$, $CeO_2$, $Na_2O3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$, and $HfO_2$.

3. The method of claim 1, wherein the ion implanted species comprises at least one of nitrogen, argon, arsenic, and boron.

4. The method of claim 1, wherein the ion implantation is a source/drain ion implantation process.

* * * * *